United States Patent [19]  
Nakata

[11] 3,936,328  
[45] Feb. 3, 1976

[54] PROCESS OF MANUFACTURING SEMICONDUCTOR DEVICES
[75] Inventor: Josuke Nakata, Itami, Japan
[73] Assignee: Mitsubishi Denki Kabushiki Kaisha, Tokyo, Japan
[22] Filed: Oct. 15, 1974
[21] Appl. No.: 515,105

Related U.S. Application Data
[63] Continuation-in-part of Ser. No. 354,144, April 24, 1973, abandoned.

[30] Foreign Application Priority Data
Apr. 28, 1972 Japan.............................. 47-43061

[52] U.S. Cl. ............... 148/171; 148/172; 148/173; 148/1.5; 148/186; 148/187; 148/189; 252/62.3 E; 252/62.3 G A
[51] Int. Cl.² .................................................. H01L 7/38
[58] Field of Search ........... 148/171, 1.5, 172, 173; 252/62.3 E, 62.3 G A

[56] References Cited
UNITED STATES PATENTS
2,727,839  12/1955  Sparks .................. 148/1.5
3,128,213  4/1964  Gault et al. .............. 148/187 X
3,152,933  10/1964  Reuschel .................. 148/175
3,664,294  5/1972  Solomon .................. 148/171 X
3,859,148  1/1975  Dawson et al. ............ 148/172

Primary Examiner—G. Ozaki
Attorney, Agent, or Firm—Wenderoth, Lind & Ponack

[57] ABSTRACT

A cylindrical substrate of semiconductive material is repeatedly incised by a saw to be formed with many parallel grooves while it has one portion of the peripheral portion remaining uncut throughout its length. Thus, the grooves define between them many parallel wafer units integrally interconnected through the uncut portion. Then all the wafer units are simultaneously cleaned, diffused with an impurity, etched, and so on. After the completion of all the simultaneous processing operations, the wafer units are removed from the uncut portion to form separate wafers.

13 Claims, 11 Drawing Figures

PROCESS OF MANUFACTURING SEMICONDUCTOR DEVICES

The application is a continuation-in-part of my U.S. application Ser. No. 354,144 filed Apr. 24, 1973 now abandoned.

BACKGROUND OF THE INVENTION

This invention relates to a process of manufacturing semiconductor devices, and more particularly to processing steps conducted at a relatively initial stage of such a process.

Previously, upon manufacturing different types of semiconductor devices, the general practice has been to use a suitable cutting machine called "a sawing machine" to cut away a substrate or an ingot of semiconductive material, for example, a single crystal thereof in the form of a rod into separate wafers after which suitable implements are used to separately subject the wafers to cleaning, etching, diffusing processes, etc. Such processes, however, have included troublesome operations of picking up the wafers one after another with a pincette to place them in and remove them from associated containers or boats. Also, it has been required to pay close attention to the contamination with impurities caused from the pincette and other sources and/or breaks and cracks of the wafers that might occur during their handling. Further in the cleaning and etching operations, the wafers have been processed by having implements used to accommodate them in isolated relationship therein because the overlap of any wafer upon another one causes those wafers to be partly impeded from being cleaned and etched. In addition, where the wafers are put in a suitable diffusion furnace to be diffused with a desired impurity, it has been required to set the wafers on their edges in the associated quartz boat so as not to overlap them. A greater part of the implements serving to hold or place the wafer thereby or therein have shown wear and tear while such implements have been required to be handled so as to be maintained chemically pure. Further, the quartz boat used in the diffusion process has given rise to problems of contaminating the wafers because it is directly contacted by the wafers and heated at elevated temperatures. This causes defects in the wafers resulting from thermal strain developed in the wafer due to a difference in coefficients of thermal expansion between the materials of the wafer and quartz boat. Also since the quartz boat has been placed in an associated quartz tube to be directly contacted by the latter, the boat might be fused with the tube during the diffusion operation.

SUMMARY OF THE INVENTION

Accordingly, it is an object of the present invention to provide a new and improved process of manufacturing semiconductor devices by which a plurality of semiconductive wafers can be handled as a single unit in at least some processing steps without the necessity of individually handling them.

It is a particular object of the present invention to provide a process of manufacturing semiconductor devices including a new and improved diffusion step requiring no special tool for holding each of a plurality of semiconductive wafers and without the necessity of individually handling the wafers.

The present invention accomplishes these objects by a process of manufacturing semiconductor devices including the steps of forming a plurality of cut grooves in a substrate of semiconductive material substantially parallel to one another while one portion of the substrate is left uncut, thereby to form a wafer bunch including a plurality of semiconductive wafer units each defined by a different pair of adjacent cut grooves, all the wafer units being integral with one another through the uncut portion of the substrate, and processing the wafer bunch so that all the wafer units of the bunch are simultaneously processed as required at least one time.

The plurality of cut grooves may preferably extend toward the uncut portion from a common side of the substrate opposing the uncut portion.

Advantageously, the substrate may be of a circularly cylindrical shape and all the plurality of cut grooves may extend toward the uncut portion of the substrate and perpendicularly to the longitudinal axis of the substrate.

BRIEF DESCRIPTION OF THE DRAWINGS

The present invention will become more readily apparent from the following detailed description taken in conjunction with the accompanying drawings, in which.

DESCRIPTION OF THE PREFERRED EMBODIMENTS

Figure 1:
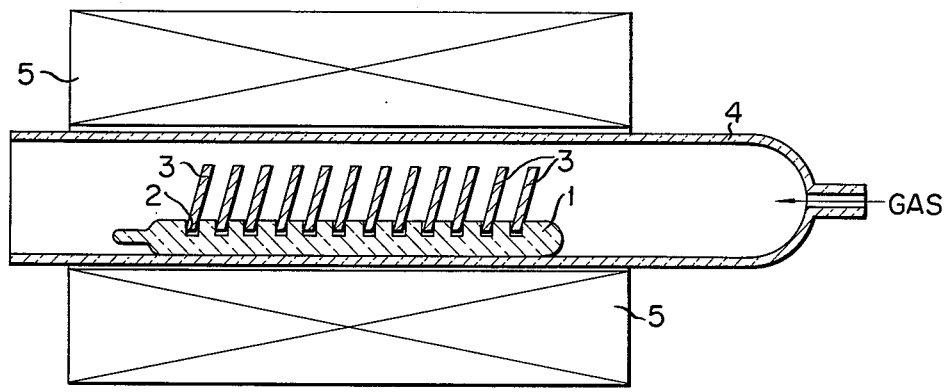
FIG. 1 is a sectional view illustrating a diffusion step of a process of manufacturing semiconductor devices in accordance with the principles of the prior art.

Referring now to FIG. 1 of the drawings, there is illustrated a conventional process of diffusing a conductivity imparting impurity into wafers of semiconductive material. The arrangement illustrated comprises a quartz boat 1 including a plurality of parallel grooves 2 on one surface, in this case the upper surface as viewed in FIG. 1 and one wafer 3 of semiconductive material set on its edge in each groove 2. The quartz boat 1 is disposed in place within a quartz tube 4 by having the other or lower surface directly contacted by the internal wall surface of the tube 4. The quartz tube 4 has one end fully open and the other end partly closed to leave a small opening and is fitted into a heating coil 5 to form a diffusion furnace.

In operation, a suitable gas containing a conductivity type imparting impurity is introduced into the interior of the quartz tube 4 through the small opening disposed on the other end thereof. The wafers 3 are heated at a diffusion temperature, for example on the order of 1250°C. by the heating coil 5 and diffused with the impurity for a predermined time interval in the well known manner. The diffusion process as above described is generally called an "open tube method" and very frequently used in manufacturing semiconductor devices through the utilization of the diffusion from the gaseous phase.

The arrangement of FIG. 1 has, in addition to the disadvantages as above described attributing to the use of the quartz boat, other disadvantages in that while the use of the quartz boat has led to the necessity of increasing the cross-sectional area of the quartz tube, its capacity to accommodate the wafers is restricted and so on.

The present invention contemplates to eliminate the disadvantages of the prior art practices as above described. The production of semiconductor devices is generally started with the step of cleaning wafers of semiconductive material and following this the etching, diffusing, etc. are conducted. In this case, it has been previously practiced to handle the wafers while they have been separated away from one another.

Figure 2A:
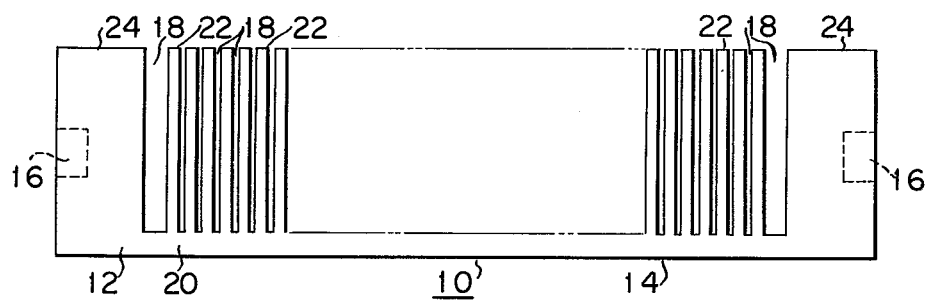
FIGS. 2a and 2b are, respectively, a front and a side elevational view of one form of a bunch of a plurality of wafer units of semiconductive material for use in manufacturing semiconductor devices in accordance with the principles of the present invention.
Figure 2B:
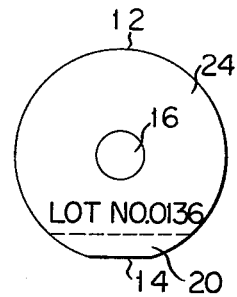

Upon practicing the present invention, a member having a plurality of integral wafer units of any suitable semiconductive material is first prepared. As an example, a member having semiconductive wafer units is illustrated in FIGS. 2a and 2b and generally designated by the reference numeral 10 in FIG. 2a.

The member 10 is formed of an ingot of single crystal silicon in the form of a circular rod, but it is to be understood that such a wafer member may be formed of any other semiconductive material. The peripheral surface of the rod-shaped ingot is partly lapped in the axial direction thereof to be formed into a longitudinally elongated flat surface 14 with a predetermined fixed width extending in parallel relationship with the longitudinal axis of the rod. After having measured the resistivity of the flat surface 14, the ingot is cut into appropriate lengths to form substrates 12 of semiconductive silicon. The substrate 12 is of a circular cross-section having a short straight portion formed of the longitudinally elongated flat surface 14 as best shown in FIG. 2b. This flat surface 14 allows the substrate to be placed on any supporting plate.

In order to facilitate the handling of the semiconductive substrate 12 during the succeeding processing steps, the substrate 12 is provided on both cut ends with a pair of small holes 16 centrally located therein. Upon automatically cleaning or etching the substrate, the holes 16 are utilized to attach the substrate to the associated machine as by having chucks fitted thereinto.

Then a suitable sawing machine is used to repeatedly incise the substrate 12 in a direction substantially orthogonal to the longitudinal axis of the substrate 12 to form a plurality of parallel grooves 18 at substantially equal intervals in the substrate. The parallel grooves 18 extend toward the uncut portion 20 from that portion diametrically opposite to the flat surface 14, in this example, the upper portion of the substrate 12, although the grooves 18 terminate short of the flat surface 14 to leave an uncut portion 20 having a predetermined thickness. A general plane formed of bottoms of the grooves 18 is substantially parallel and opposite to the flat surface 14. All the grooves 18 except for both end grooves 18 are equal in axial width to one another to define therebetween a plurality of semiconductor wafer units 22 substantially equal in thickness to one another and physically interconnected through the uncut portion 20.

On the other hand, both end grooves 18 are wider in axial width than the remaining grooves 18 to define holding portions 24 with both ends of the substrate 12 serving to hold the substrate 12 through the holes 16 as above described. Therefore, the holding portions 24 are not used as wafers of semiconductive material and accordingly is not necessary to have their resistivity controlled. However, that portion of the substrate disposed between the holding portions 24 must have a resistivity required for the semiconductor device. In other words, all the wafer units 22 should have respective resistivities within the limits required for the semiconductor device. It will readily be understood that for $n$ grooves 18 $(n - 1)$ semiconductive wafer units 22 are formed therebetween.

In this way the substrate 12 has been formed into a comb-shaped section.

The existing sawing machines decrease the width of the grooves 18 as viewed axially or lengthwise of the substrate 12 to a minimum magnitude of 250 microns. However, the axial width of the grooves 18 may be advantageously larger than the magnitude just specified for particular applications. Where the grooves 18 have been cut into the substrate 12 with the axial width such as above described, it is possible to simultaneously process a multiplicity of wafer units 22 by processing the single substrate 12.

As well known in the art, the surface of the wafer unit 22 as cut by the existing sawing machines alone may include a damaged layer having a minimum depth of 5 microns. In semiconductor devices such as power rectifiers, and power thyristors required to render the depth of diffusion equal to or greater than 5 microns, even the damage layer of such a thickness remaining on the surface thereof particularly offers no problem. This permits the omission of the steps of lapping and etching semiconductive wafers, leading to a great decrease in manufacturing costs.

On the other hand, in semiconductor devices including a shallow diffusion layer whereby the presence of the damaged layer having a thickness as above specified adversely affects the characteristics theeof, the member 10 as formed by cutting the semiconductor ingot by a suitable sawing machine in the manner as above described can be suitably etched to render the damaged layer thin. Alternatively, the utilization of a suitable cutting device other than the sawing machine will make it possible to form semiconductive wafer units having thinner damaged layers.

While the wafer units 22 are shown in FIG. 2a as being identical in thickness to one another, it is to be understood that the wafer units may have their widths variable at will in accordance with their required resistivity.

Because of its configuration as shown in FIGS. 2a and 2b, wherein the respective wafer units 22 are integrally joined at one end to one portion of the semiconductive rod or their blank to be put in the form of a comb, the substrate has several advantages. For example, a multiplicity of wafer units can be processed at a time and yet fixtures previously required for holding semiconductive wafers while physically isolating them from one another, for example, binding agents, quartz boats, etc.

become unnecessary. Further, since all the grooves 18 extend from a common side of the substrate 12 toward the uncut portion 20, the wafer units 22 can readily be cleaned and/or etched. After the completion of the cleaning operation, the cleaned substrates can be dried and then placed in a suitable diffusion furnace in the manner shown in either FIG. 3 or FIG. 4.

Figure 3:
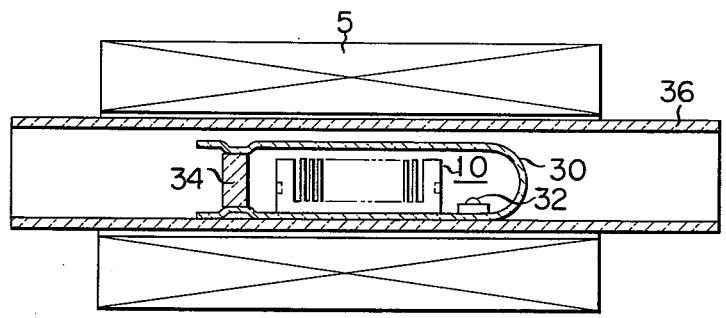
FIGS. 3 and 4 are sectional views illustrating different diffusion steps using the bunch of semiconductive wafer units shown in FIGS. 2a and 2b.
Figure 4:
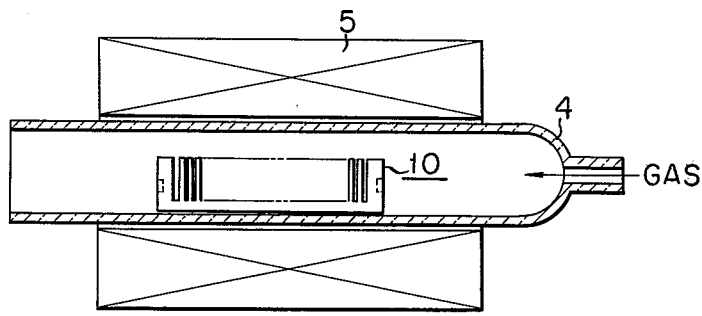

FIG. 3 illustrates a process of diffusing a conductivity imparting impurity or a dopant into a substrate of semiconductive material called a "closed tube process", while FIG. 4 illustrates a similar process called an "open tube process". In an arrangement as shown in FIG. 3, the wafer member 10, as shown in FIG. 2, is put in a quartz tube 30 having one end closed along with a suitable impurity source 32 including an amount of silicon alloyed with aluminum. Thus, the wafer bunch 10 is directly contacted by the internal wall surface of the quartz tube 30 by having the flat surface 14 thereof disposed upon that wall surface. Then a short quartz rod 34 plugs the other or open end of the quartz tube 30 after which the quartz tube 30 is evacuated. While the interior of the quartz tube 30 is maintained evacuated, the quartz rod 34 is fused to the other end of the quartz tube 30 to form a vacuum seal therebetween. The assembly thus prepared is put in place within an open ended quartz tube 36 forming a diffusion furnace with a heating coil 5. Within the furnace the wafer member 10 is heated at a predetermined temperature for a predetermined time interval to permit the aluminum from the source 32 to be diffused into the surface of each wafer unit 22 in the manner well known in the art.

FIG. 4 shows an arrangement similar to that illustrated in FIG. 1 with the exception that the wafer member 10 is directly contacted by the internal wall surface of a quartz tube 4 identical to that shown in FIG. 1 with the inner quartz tube 30 as shown in FIG. 3 omitted. As in the arrangement of FIG. 1, a gas containing a suitable impurity is introduced into the quartz tube 4 from the righthand end, as viewed in FIG. 4, and exhausted through the lefthand end, thereby to diffuse the impurity into the wafer units of the member 10.

After the completion of the required diffusion, the wafer member is removed from the diffusion quartz tube and then processed as desired as far as all the wafer units of the member can be simultaneously treated. The wafer units thus processed are broken away from the uncut portion 20 of the member 10 to be separated away from one another. If the wafer units are broken away from the uncut portion 20 in a particular direction of the single crystal blank, for example, along a plane of cleavage thereof, the fracture surfaces thereof will be neat.

The wafer units thus separated can be processed as required to form desired semiconductor devices.

While the invention has been illustrated and described in terms of the semiconductive wafer units formed by repeatedly incising the substrate in a direction perpendicular to the longitudinal axis thereof, it is to be understood that within the scope of the present invention the substrate may be repeatedly incised in a direction other than such a perpendicular direction in accordance with the particular semiconductor devices or processes of manufacturing the same. This will now be described in conjunction with FIGS. 5 and 6.

Figure 5A:
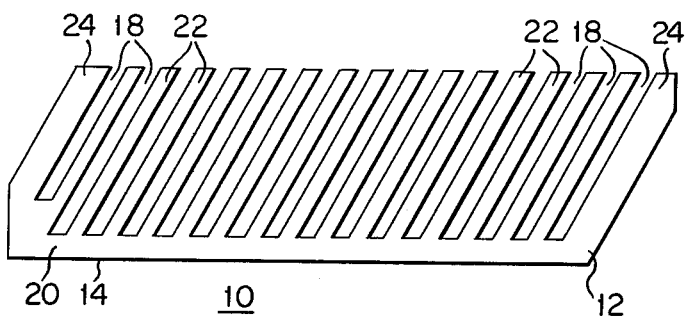
FIGS. 5a and 5b are views similar to FIGS. 2a and 2b, respectively, but illustrating a modification of the bunch of semiconductive wafer units shown in FIGS. 2a and 2b.
Figure 5B:
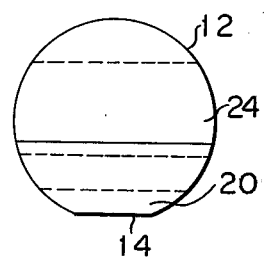

FIG. 5 shows a substrate 12 repeatedly incised in a direction forming a predetermined acute angle with the longitudinal axis thereof to include cut grooves 18 tilted to that longitudinal axis with the lower portion thereof as viewed in FIG. 4 remaining uncut.

Figure 6A:
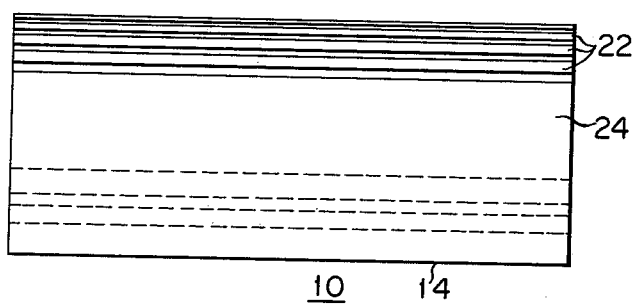
FIGS. 6a and 6b are views similar to FIGS. 2a and 2b, respectively, but illustrating another modification of the bunch of semiconductor wafer units shown in FIGS. 2a and 2b.
Figure 6B:
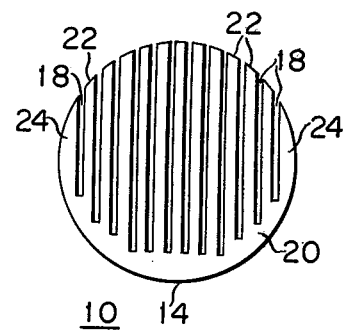

FIG. 6 shows a substrate 12 repeatedly incised in a direction parallel to a plane passing through the longitudinal axis thereof to include cut grooves 18 perpendicular to those shown in FIG. 2. The arrangement illustrated is effective for providing semiconductive wafers large in area.

In other respects, each of the arrangements shown in FIGS. 5 and 6 is substantially identical to that illustrated in FIG. 2 and like reference numerals have been employed to identify the components which are similar or corresponding to those shown in FIG. 2.

Figure 7:
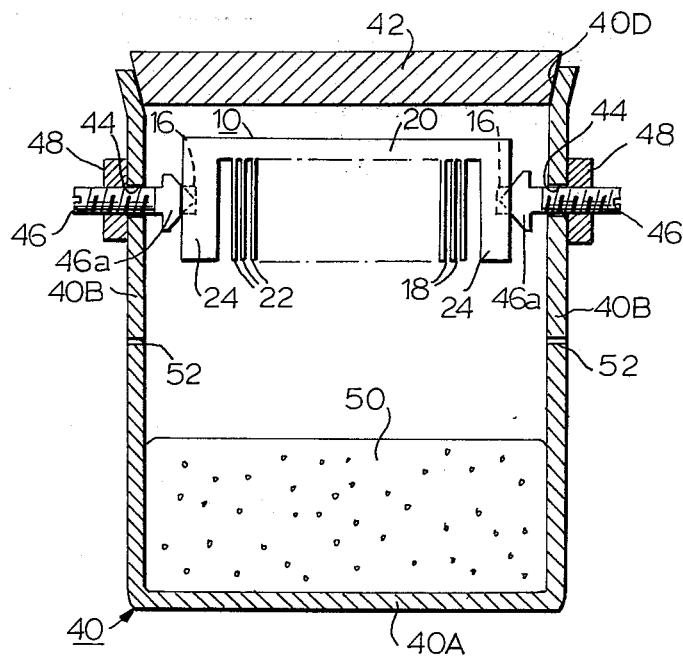
FIG. 7 is a sectional view of a crucible for effecting the growth-from-liquid phase on the wafer member shown in FIGS. 2a and 2b which has been prepared for such growth.

An arrangement as illustrated in FIG. 7 comprises a container or a crucible generally designated by the reference numeral 40 and formed of quartz or graphite. The crucible 40 includes a bottom wall 40A, a pair of opposite side walls 40B disposed in spaced substantially parallel relationship, and another pair of similar side walls (not shown) and is opened at one end 40D, the upper end as viewed in FIG. 7. The open end 40D is hermetically closed with a detachable lid 42 made of a material similar to that of the crucible 40.

The side walls 40B of the crucible 40 have a pair of openings 44 on opposite sides of the crucible and extending through the upper portion thereof. A push bolt 46 of quartz or graphite extends through each opening 44 into the interior of the crucible 40 and includes a generally cone-shaped portion 46a disposed at the inner end thereof to be opposite that formed at the inner end of the other bolt 46 for a purpose that will be apparent hereinafter. Both push bolts 46 are adjustably fixed to the mating side walls 40B by means of graphite lock nuts 48 screw threaded thereonto and contacting the outer surfaces of the adjacent side walls 40B, respectively.

As shown in FIG. 7, a wafer member 10, such as shown in FIGS. 2a and 2b is disposed in place within the crucible 40 by fitting the inner end portions 46a of the push bolts 46 into the central holes 16 on both end faces thereof, respectively, to longitudinally support the wafer member 10.

A melt 50 is shown in FIG. 7 as being charged into the crucible 40, but only to such a level that the melt does not contact the wafer member 10 in the position of the crucible 40 illustrated in FIG. 7, where the lid 42 is located at the top while the bottom wall 40A is located at the bottom.

As is well known in the art, the melt has a composition including a solvent or a molten metal, a solute and a conductivity type imparting impurity properly selected in accordance with the type of the semiconductive material of the particular wafer bunch. For example, semiconductive materials of the wafer member and the associated solvent metal, solutes and impurities are listed in the following Table.

Table

| Semiconductive Material of Wafer Member | Solvent, Molten Metal | Solute | Melt Conductivity Type Imparting impurity | |
|---|---|---|---|---|
| | | | N Type | P Type |
| Si | Ga, Sn or Au | Si | Sb, P or As | Ga, B or Al |
| GaAs | Ga | GaAs or | S, Te or Se | Zn, Mg or Cd |
| GaP | Ga | GaP | S, Te or Se | Zn, Mg or Cd |
| GaAlAs | Ga | GaAlAs or GaAs | S, Te or Se | Zn, Mg or Cd |
| GaSb | Ga | Gasb | S, Te or Se | Zn, Mg or Cd |

As an example, it is assumed that a wafer member is formed of gallium phosphide (Gap) in order to produce semiconductor luminescent diodes. Under the assumed condition, a corresponding melt can be prepared by dissolving a solute, GaP into molten Ga until the molten Ga is saturated with the GaP and adding to the melt a proper amount of that impurity imparting the desired type conductivity. If an N type impurity is selected, then the resulting melt may include 157 gr. of molten Ga and a mixture of $46 \times 10^{-3}$ molar % of Te, 2.9 molar % of GaP and 0.088 molar % of $Ga_2O_3$.

The arrangement of FIG. 7 is then fixedly secured in a quartz tube placed within a growth furnace, although the quartz tube and furnace are not illustrated for purposes of simplicity and ease of understanding. The quartz tube is arranged to be turned upside down within the furnace. With the quartz tube turned upside down, the crucible 40 is inverted, as shown in FIG. 7a, wherein like reference numerals designate components identical to those illustrated in FIG. 7.

Figure 7A:
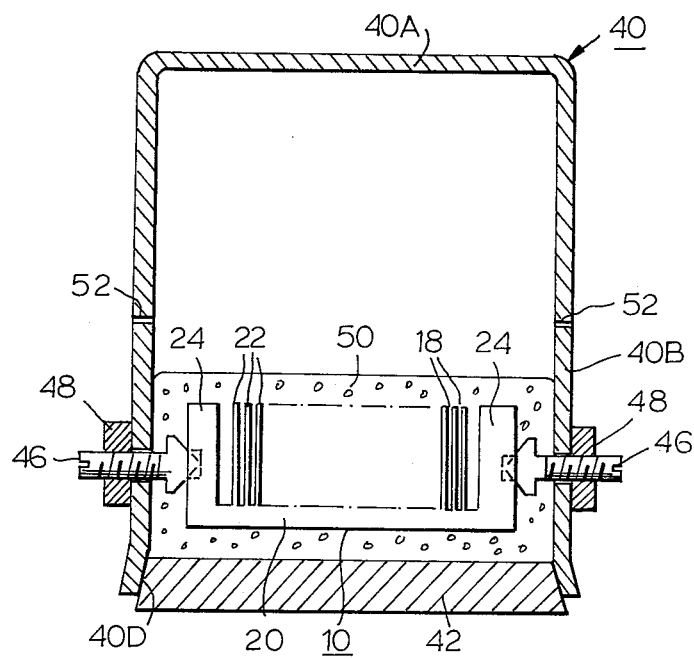
FIG. 7a is a view similar to FIG. 7 but illustrating the crucible of FIG. 7 in its operating position.

As shown in FIG. 7a, the crucible 40 is inverted so that the lid 42 is located at the bottom, while the bottom wall 40A is located at the top. As a result, the wafer member 10 is fully immersed into the melt 50 with all the grooves 18 of the wafer member 10 filled with the melt 50.

In FIGS. 7 and 7a, the crucible 40 is shown as including a pair of minute holes 52 extending horizontally through the opposite side walls 40B at the centers thereof. More specifically, the holes 52 are positioned to prevent the melt 50 from overflowing externally of the crucible 40 in either of the positions of the crucible illustrated in FIGS. 7 and 7a, respectively. The purpose of the holes 52 is to permit a gas or gases within the crucible 40 to be externally exhausted or to introduce the desired impurity in the form of a gas into the melt 50 after the interior of the crucible 40 has been hermetically closed by the lid 42. It is noted that the holes 52 are not always required to be provided on the crucible 40 and that the same may be omitted, if desired.

The growth from liquid phase can be accomplished as follows. Before the wafer member 10 is disposed in place within the crucible 40, melt 50 such as above-specified is first charged in the crucible 40 with the lid 42 removed therefrom. Then a wafer member 10 is put in the crucible 40, after which the push bolts 46 are moved toward each other until the crucible 40 is sandwiched between and firmly held by the bolts 46. Then the nuts 48 are turned to fix the bolts 46 to the mating side walls 40B of the crucible 40 and the crucible 40 is hermetically closed by the lid 42.

Following this, the hermetically closed crucible 40 is fixedly disposed in a quartz tube (not shown) and placed in a growth furnace (not shown) while the bottom wall 40A and the lid 42 are located down and up, respectively, as shown in FIG. 7. Then hydrogen is circulated through the furnace. Under these circumstances, the furnace is heated to a temperature of 1030°C and held at that temperature for about 15 minutes. Thereafter the quartz tube is turned upside down within the furnace so that the wafer member 10 is fully immersed in the melt 50 as shown in FIG. 7a. the temperature of the furnace is then decreased to 900°C. at a cooling rate of from 2° to 3°C. per minute to grow a semiconductor layer (not shown) on the wafer member 10 from the melt 50. When the temperature of the furnace has reached 900°C., the crucible 40 is again turned to its original position as shown in FIG. 7, whereby growth of the semiconductor layer on the wafer member 10 stops. The furnace is left to be cooled to a sufficiently low temperature, such as room temperature, after which the crucible 40 is removed from the quartz tube. Then the wafer member 10 with the semiconductor layer grown thereon is removed from the crucible 40.

In the process as above-described, the use of the melt as specified would result in the growth of N type gallium phosphide (GaP) in the form of a layer having a uniform thickness of about 45 microns upon each main face of all wafer units 22 of the wafer member 10.

If desired, one groove similar and parallel to the grooves 18 on the main faces may be provided after growing the semiconductor material thereon. As a result, that portion of the melt 50 contacting these opposite main faces has a width uniform along each groove 18. This is effective for forming grown layers of uniform thickness on the main faces of the wafer units 22.

As previously described, the wafer member 10 includes a multiplicity of wafer units 22 united to one another. Thus, uniform layers can be simultaneously grown upon all the wafer units 22 from the melt 50 or the liquid phase, resulting in an increase in working efficiency.

A plurality of semiconductor wafers may be cut into each wafer unit 22 with the layers grown on both main faces to divide each of the wafer units 22 into two portions thereby forming wafer units including the grown layers on one main face thereof alone. It is also possible to repeat the process as above described to grow semiconductor layers on the main faces of each of the divided wafer units.

It is important that the growth from the liquid phase be effected while all the grooves 18 of the wafer member 10 are filled with the melt 50. More specifically, all the grooves 18 are parallel to each other and therefore each pair of adjacent wafer units 22 has its opposite ends separated from one another and may be disposed and maintained in parallel relationship by spacers interposed therebetween and subject to a growth-from-liquid phase process as in the prior art practice. However, this operation takes a long time and results in a poor working efficiency. Also, upon carrying the wafers between the spacers, the wafers are apt to be broken. Thermal stresses, furthermore, can be undesirably applied to the wafers during heating for growth-from-liquid phase, and this may cause the electric characteristics of the wafers to deteriorate. In addition, the use of the spacers inevitably causes an increase in spacing between each pair of adjacent wafers. Thus, the resulting assembly including a multiplicity of wafers becomes large and this leads not only to an increase in the required dimension of a crucible housing of the wafer assembly therein, but also to the use of a large amount of an expensive melt from which the growth is effected.

However, the objections to and disadvantages of the prior art practices using the spacers as above-described can be substantially eliminated by using the wafer member disclosed in the present invention in growing the semiconductor layer on the member from the liquid phase. It has been found that the spacing between the adjacent wafer units can be as narrow as on the order of from 0.3 to 0.5 mm. This results in a great increase in the degree to which the wafer units are integrated. Accordingly, a wafer member including a multiplicity of wafer units can be quite small as compared with the prior art wafer assemblies, and therefore the required amount of an expensive melt can also be decreased.

While the process of growing a semiconductor layer on a wafer member from the liquid phase has been described as comprising the use of the crucible 40 adapted to be turned upside down to cover the wafer member 10 with the melt 50, it is to be understood that the wafer member 10 may be effectively used for the growth-from-liquid phase by utilizing the well-known dipping technique. In the latter event, the wafer member is suspended into a melt and pulled up from the latter after the melt has been cooled to a predetermined temperature.

The present invention has several advantages. For example, it eliminates the necessity of separately handling individual wafers of semiconductive material for cleaning, etching, diffusing, etc. as in the prior art practice. Therefore, much manual effort is saved and a large number of wafers can be simultaneously processed. This is because the wafer member has a large number of semiconductive wafer units integrally connected at one edge to one portion thereof and the member in that condition is processed as desired.

The member may also go through various processes previously considered inapplicable to work semiconductive wafers unless the wafers had been separated from one another. The wafer member may be advantageously processed so that another layer of semiconductive material is grown on each of the wafer units from the liquid phase. This is advantageous since, due to their connection to a common blank, the wafer units are simultaneously processed, and a good temperature distribution results from the heat conduction through that portion of the blank connecting them and spacing between the wafer units are maintained parallel and constant which leads to further advantageous results.

In addition, the wafer units of each member may be handled at any desired angle of inclination and the space occupied by the wafer units for storing and housing purposes can be reduced. Further, the wafer units can be collectively processed for each lot of the single crystal leading to the facilitation of their control. To this end, a lot number may be designated on one of the end surfaces of the substrate, as shown by "Lot No. 0136" in FIG. 2b or on both end faces thereof, to facilitate the handling of the members.

Since the wafer member is placed in a diffusion furnace without a quartz boat otherwise required to be used, as above-described in conjunction with FIGS. 3 and 4, the following advantages are particularly provided:

a. the diffusion cost can be reduced;
b. the wafers of semiconductive material are capable of being simultaneously diffused with an impurity increase in the number;
c. the wafers are prevented from being contaminated with impurities originating from the quartz boat;
d. since no space is required for the quartz boat, the diffusion furnace can be decreased in diameter, leading to a reduction in the cost of installation; and
e. because no fusion occurs between the diffusion quartz tube and the quartz boat, the diffusion can be conducted at temperatures higher than that previously employed. This permits an increase in an impurity concentration on and adjacent the surface of each wafer and/or a decrease in a diffusion time.

While the present invention has been illustrated and described in conjunction with a few preferred embodiments thereof, it is to be understood that numerous changes and modifications may be resorted to without departing from the spirit and scope of the invention. For example, the quartz tube as shown in FIGS. 3 and 4 may have disposed therein more than one of the wafer members in accordance with a length of a soaking zone established therein. Also if desired, the diffusion quartz tube may be disposed vertically rather than horizontally. In the latter event, the associated wafer member or members may readily be longitudinally disposed in the vertical tube for diffusion.

What is claimed is:

1. A process of manufacturing semiconductor devices comprising the steps of first forming a plurality of grooves in a substrate of semiconductive material to be substantially parallel to one another while an uncut portion is left in one portion of said substrate, thereby to form a wafer member including a plurality of semiconductive wafer units each defined by a different pair of adjacent grooves, all the wafer units being maintained integrally with one another through said uncut portion of said substrate and then processing said wafer member by growing semiconductor material on each of said plurality of wafer units from a liquid phase.

2. A process of manufacturing semiconductor devices as claimed in claim 1 wherein all said plurality of cut grooves extend toward said uncut portion from a common side of the substrate opposing the uncut portion.

3. A process of manufacturing semiconductor devices as claimed in claim 2 wherein said substrate is provided on the outer peripheral surface with a flat surface extending along the longitudinal axis of the substrate and disposed on said uncut portion of the substrate.

4. A process of manufacturing semiconductor devices as claimed in claim 1 wherein said substrate is of a cylindrical shape and wherein all said plurality of cut grooves extend toward said uncut portion of said substrate perpendicularly to the longitudinal axis of the substrate.

5. A process of manufacturing semiconductor devices as claimed in claim 1 wherein said substrate is of a cylindrical shape and wherein all said plurality of cut grooves extend toward said uncut portion and in a direction tilted at a predetermined acute angle to the longitudinal axis of the substrate.

6. A process of manufacturing semiconductor devices as claimed in claim 1 wherein said substrate is of a cylindrical shape and wherein said plurality of cut grooves extend toward said uncut portion in parallel relationship with the longitudinal axis of the substrate.

7. A process of manufacturing semiconductor devices as claimed in claim 1 wherein said processing step involves growing the semiconductive material on each of said plurality of wafer units while all said grooves are filled with a melt.

8. A process of manufacturing semiconductor devices as claimed in claim 7 wherein said melt includes a molten metal, a solute, and a conductivity type imparting impurity.

9. A process of manufacturing semiconductor devices as claimed in claim 7 wherein said processing step is effected in a crucible having said wafer member disposed therein.

10. A process of manufacturing semiconductor devices as claimed in claim 9 comprising the further steps of disposing a melt in said crucible along with said wafer member and inverting said crucible to grow the semiconductive material, thereby filling all of said grooves of said wafer member with said melt.

11. A process of manufacturing semiconductor devices as claimed in claim 10 comprising the further step of placing in a furnace and inverting said crucible upon said furnace reaching a predetermined temperature.

12. A process of manufacturing semiconductor devices as claimed in claim 1 comprising the further step of forming another groove parallel to said groove on each of said plurality of wafer units after growing the semiconductive material on the latter.

13. A process of manufacturing semiconductor devices as claimed in claim 12 comprising the step of further growing a semiconductive material from a melt on each of said plurality of wafer units after forming said another groove.

* * * * *